(12) United States Patent
Je et al.

(10) Patent No.: US 11,467,077 B2
(45) Date of Patent: Oct. 11, 2022

(54) FLUID VISCOSITY MEASURING DEVICE

(71) Applicant: ELECTRONICS AND TELECOMMUNICATIONS RESEARCH INSTITUTE, Daejeon (KR)

(72) Inventors: Chang Han Je, Daejeon (KR); Yil Suk Yang, Daejeon (KR); Hyunjoong Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 437 days.

(21) Appl. No.: 16/735,899

(22) Filed: Jan. 7, 2020

(65) Prior Publication Data
US 2020/0225138 A1 Jul. 16, 2020

(30) Foreign Application Priority Data
Jan. 14, 2019 (KR) .................. 10-2019-0004873

(51) Int. Cl.
*G01N 11/16* (2006.01)
*H01L 41/113* (2006.01)
*H01L 41/053* (2006.01)

(52) U.S. Cl.
CPC ............ *G01N 11/16* (2013.01); *H01L 41/053* (2013.01); *H01L 41/1132* (2013.01); *H01L 41/1136* (2013.01)

(58) Field of Classification Search
CPC .. G01N 11/16; G01N 9/002; G01N 2009/006; G01N 2011/006;
(Continued)

(56) References Cited

U.S. PATENT DOCUMENTS 4,799,378 A * 1/1989 Portman, Jr. ......... H01L 41/107
                                                      73/54.27
6,205,857 B1 * 3/2001 Nakajima .......... G01C 19/5607
                                                     73/504.16
(Continued)

FOREIGN PATENT DOCUMENTS

KR    1020050050425 A    5/2005
KR    20080097559 A    11/2008
(Continued)

OTHER PUBLICATIONS

Christophe Boss et al., "A viscosity-dependent affinity sensor for continuous monitoring of glucose in biological fluids", Biosensors and Bioelectronics, vol. 30, pp. 223-228, Dec. 2011.

*Primary Examiner* — Robert R Raevis
(74) *Attorney, Agent, or Firm* — Rabin & Berdo, P.C.

(57) ABSTRACT

Provided is a fluid viscosity measuring device including a support structure having an opening part, the opening part penetrating the support structure in a first direction, a driving resonator fixed to the support structure and extending to overlap the opening part, and a detection resonator fixed to the support structure and extending parallel to the driving resonator, the detection resonator being spaced apart from the driving resonator in the first direction. The driving resonator includes a first piezoelectric body. The detection resonator includes a second piezoelectric body. The first piezoelectric body and the second piezoelectric body have the same shape.

12 Claims, 16 Drawing Sheets

(58) Field of Classification Search
CPC ............. H01L 41/1136; H01L 41/1132; H01L 41/053; H01L 41/0533; H01L 41/094
USPC ........... 73/54.41, 24.01, 24.04, 24.05, 24.06, 73/32 A, 61.53, 597, 599, 861.27–861.31
See application file for complete search history.

(56) References Cited

U.S. PATENT DOCUMENTS

| | | |
|---|---|---|
| 7,878,044 B2 | 2/2011 | Andle |
| 9,038,443 B1 | 5/2015 | Pace et al. |
| 9,970,853 B2 | 5/2018 | Lal et al. |
| 10,209,170 B2 | 2/2019 | DiGrazia et al. |
| 2005/0112621 A1 | 5/2005 | Kim et al. |
| 2014/0015618 A1* | 1/2014 | Ishikawa .............. H03H 9/1021 73/504.16 |
| 2016/0139106 A1 | 5/2016 | Lee et al. |
| 2016/0223448 A1 | 8/2016 | Kim et al. |

FOREIGN PATENT DOCUMENTS

| | | | |
|---|---|---|---|
| KR | 100899027 B1 | | 5/2009 |
| KR | 20100000283 A | | 1/2010 |
| KR | 101171518 B1 | | 8/2012 |
| KR | 20150060853 A | | 6/2015 |
| WO | 2011058874 | * | 5/2011 |

\* cited by examiner

FLUID VISCOSITY MEASURING DEVICE

CROSS-REFERENCE TO RELATED APPLICATIONS

This U.S. non-provisional patent application claims priority under 35 U.S.C. § 119 of Korean Patent Application No. 10-2019-0004873, filed on Jan. 14, 2019, the entire contents of which are hereby incorporated by reference.

BACKGROUND

The present disclosure herein relates to a fluid viscosity measuring device, and more particularly, to a fluid viscosity measuring device based on a microelectromechanical systems (MEMS) resonator including a piezoelectric body.

MEMS resonators are micro devices that exhibit a maximum mechanical displacement by resonating when a signal corresponding to the resonance frequency of a structure is inputted. The resonant frequency of the MEMS resonator is determined by the mechanical properties (dimensions, materials, and shapes) of a resonance target structure. In addition to the mechanical properties of the resonator itself, the resonance properties of the resonator are also influenced by the operating environment (temperature, pressure, fluid), so that by using this phenomenon, it can be utilized as a sensor for detecting the operating environment from measuring the properties of the MEMS resonator.

Recently, fluid property analysis has emerged as an important issue in the medical and biotechnology sectors. In addition, throughout the industry, it is very important to accurately control and measure the properties of fluids to ensure accurate operation and performance. The properties of the fluid are represented by viscosity and density, and there have been many methods to measure them. Recently, technologies for miniaturization, low cost, and real-time/continuous measurement of fluid viscosity measuring devices have been researched and developed. In particular, research on a fluid viscosity measuring device with the MEMS technology, which appears with the development of semiconductor technology, is actively being conducted.

SUMMARY

The present disclosure provides an ultra-small fluid viscosity measuring device that is easy to manufacture and excellent in reliability.

An embodiment of the inventive concept provides a fluid viscosity measuring device including: a support structure having an opening part, the opening part penetrating the support structure in a first direction; a driving resonator fixed to the support structure and extending to overlap the opening part; and a detection resonator fixed to the support structure and extending parallel to the driving resonator, the detection resonator being spaced apart from the driving resonator in the first direction, wherein the driving resonator comprises a first piezoelectric body, wherein the detection resonator comprises a second piezoelectric body, wherein the first piezoelectric body and the second piezoelectric body have the same shape.

In an embodiment, each of the driving resonator and the detection resonator may have a shape of a cantilever having a free end in the opening part.

In an embodiment, the first piezoelectric body and the second piezoelectric body may have the same thickness in the first direction.

In an embodiment, the first piezoelectric body and the second piezoelectric body may extend in a second direction perpendicular to the first direction and have the same length in the second direction.

In an embodiment, the driving resonator may include driver electrodes spaced apart from each other with the first piezoelectric body interposed therebetween, wherein the detection resonator may include sensor part electrodes spaced apart from each other with the second piezoelectric body interposed therebetween.

In an embodiment, the driving resonator may include a driver insulating film surrounding the first piezoelectric body and the driver electrodes, wherein the detection resonator may include a sensor part insulating film surrounding the second piezoelectric body and the detection resonator.

In an embodiment, the driving resonator and the detection resonator may have the same size and shape.

In an embodiment, the driving resonator and the detection resonator may have the same natural frequency.

In an embodiment, the support structure may include a first support layer, a second support layer, and a third support layer sequentially stacked, wherein the driving resonator may be fixed to an upper surface of the first support layer, wherein the detection resonator may be fixed to a lower surface of the third support layer.

In an embodiment, a thickness of the first direction of the second support layer may be greater than a sum of a thickness of the driving resonator and a thickness of the detection resonator.

In an embodiment, the driving resonator and the detection resonator may extend in a second direction perpendicular to the first direction, wherein a distance between the driving resonator and the detection resonator may be constant along the second direction.

In an embodiment, the fluid viscosity measuring device may further include a support substrate disposed on the support structure and having one side partially exposed by the opening part.

In an embodiment of the inventive concept, a fluid viscosity measuring device includes: a support structure having an opening part, the opening part penetrating the support structure in a first direction; first and second resonator support parts extending from the support structure and disposed in the opening part; a driving resonator disposed on the first resonator support part and extending in a second direction intersecting the first direction; and a detection resonator disposed on the second resonator support part and extending in the second direction, wherein the driving resonator includes a first piezoelectric body, wherein the detection resonator includes a second piezoelectric body, wherein the driving resonator and the detection resonator are disposed to face each other.

In an embodiment, the fluid viscosity measuring device may further include first connection parts connecting the support structure and the first resonator support part and second connection parts connecting the support structure and the second resonator support part.

In an embodiment, the first connection parts may be spaced apart from each other in a third direction perpendicular to the first direction and the second direction, wherein the second connection parts may be spaced apart from each other in the third direction.

In an embodiment, the driving resonator and the detection resonator may be spaced apart from each other in the first direction.

In an embodiment, the driving resonator and the detection resonator may be spaced apart from each other in the second direction.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
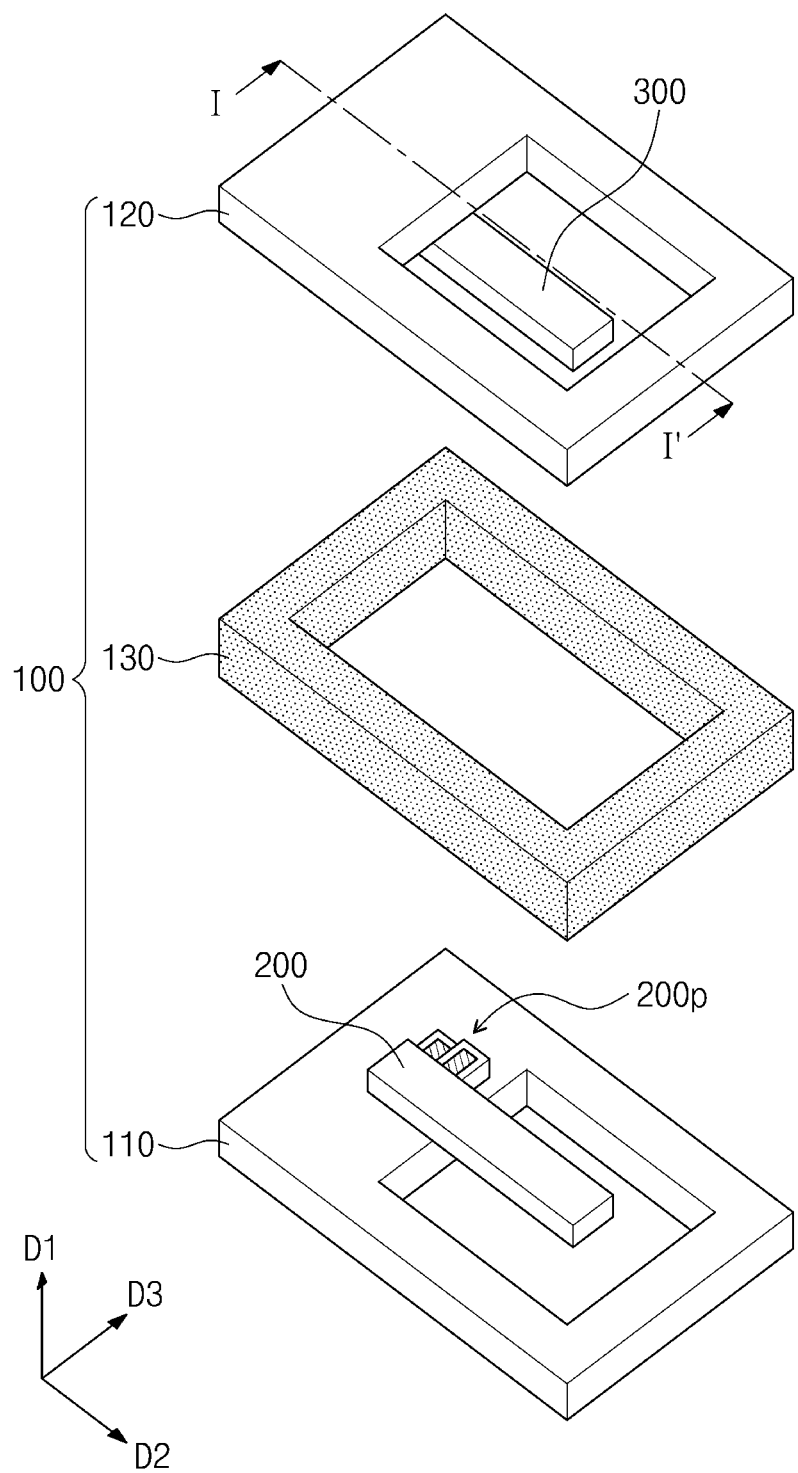
FIG. 1 is an exploded perspective view showing a fluid viscosity measuring device according to embodiments of the inventive concept.

In order to fully understand the configuration and effects of the technical spirit of the inventive concept, preferred embodiments of the technical spirit of the inventive concept will be described with reference to the accompanying drawings. However, the technical spirit of the inventive concept is not limited to the embodiments set forth herein and may be implemented in various forms and various modifications may be applied thereto. Only, the technical spirit of the inventive concept is disclosed to the full through the description of the embodiments, and it is provided to those skilled in the art that the inventive concept belongs to inform the scope of the inventive concept completely. Those of ordinary skill in the art will understand that the concepts of the inventive concept may be practiced in any suitable environment.

The terms used in this specification are used only for explaining specific embodiments while not limiting the inventive concept. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

In this specification, when a film (or layer) is referred to as being on another film (or layer) or substrate, it may be directly on the other film (or layer) or substrate, or a third film (or layer) may be interposed.

It will be understood that the terms "first", "second", and "third" are used herein to describe various regions, films (or layers), and so on, but these regions, films (or layers), and so on should not be limited by these terms. These terms are only used to distinguish any predetermined region or film (or layer) from another region or film (or layer). Embodiments described herein include complementary embodiments thereof. Like reference numerals refer to like components throughout the specification.

Unless otherwise the terms used in embodiments of the inventive concept are defined differently, they may be interpreted as commonly known to those skilled in the art.

Hereinafter, a fluid viscosity measuring device according to embodiments of the inventive concept will be described in detail with reference to the drawings.

Figure 2:
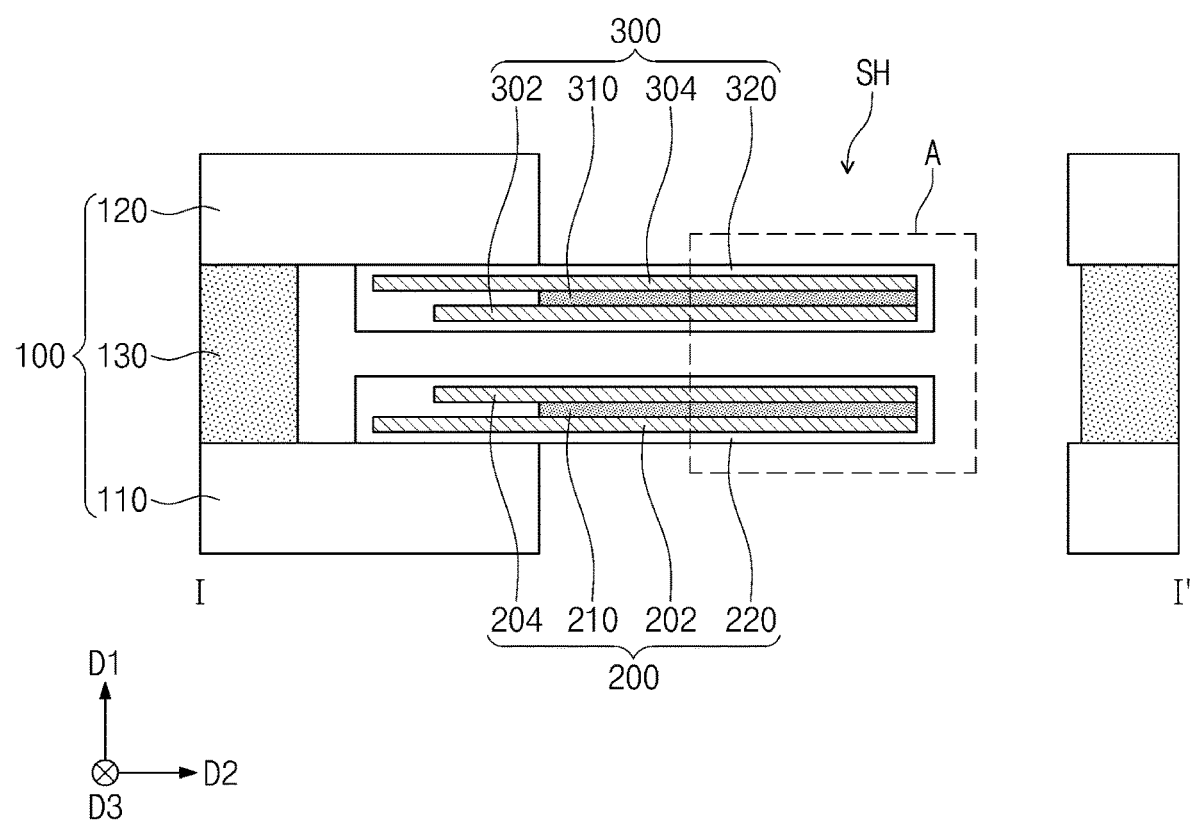
FIG. 2 is a cross-sectional view of a fluid viscosity measuring device according to embodiments of the inventive concept and corresponds to line I-I' of FIG. 1.
Figure 3:
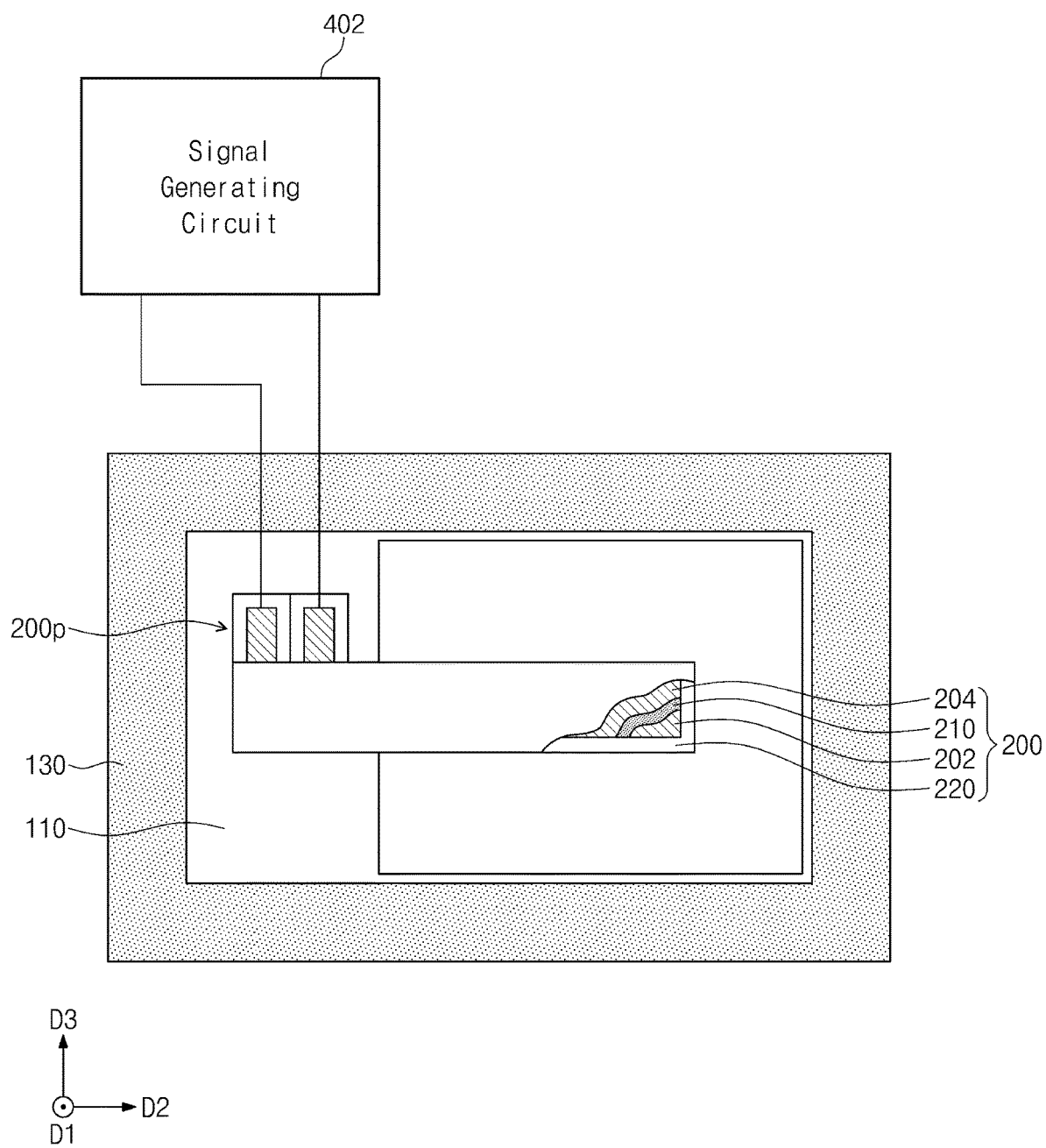
FIG. 3 is a plan view showing a portion of a fluid viscosity measuring device according to embodiments of the inventive concept.
Figure 4:
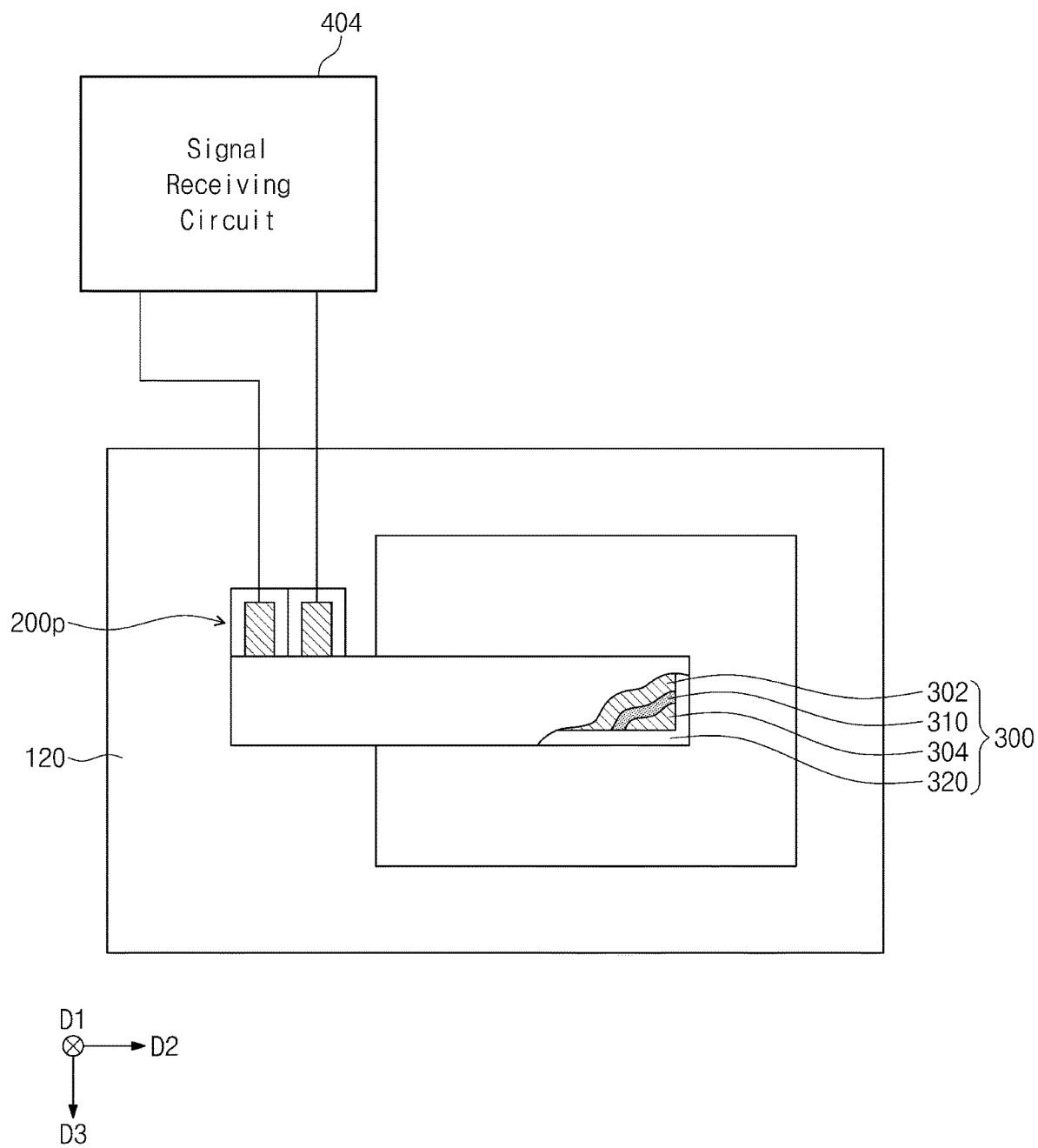
FIG. 4 is a plan view showing another portion of a fluid viscosity measuring device according to embodiments of the inventive concept.
Figure 5:
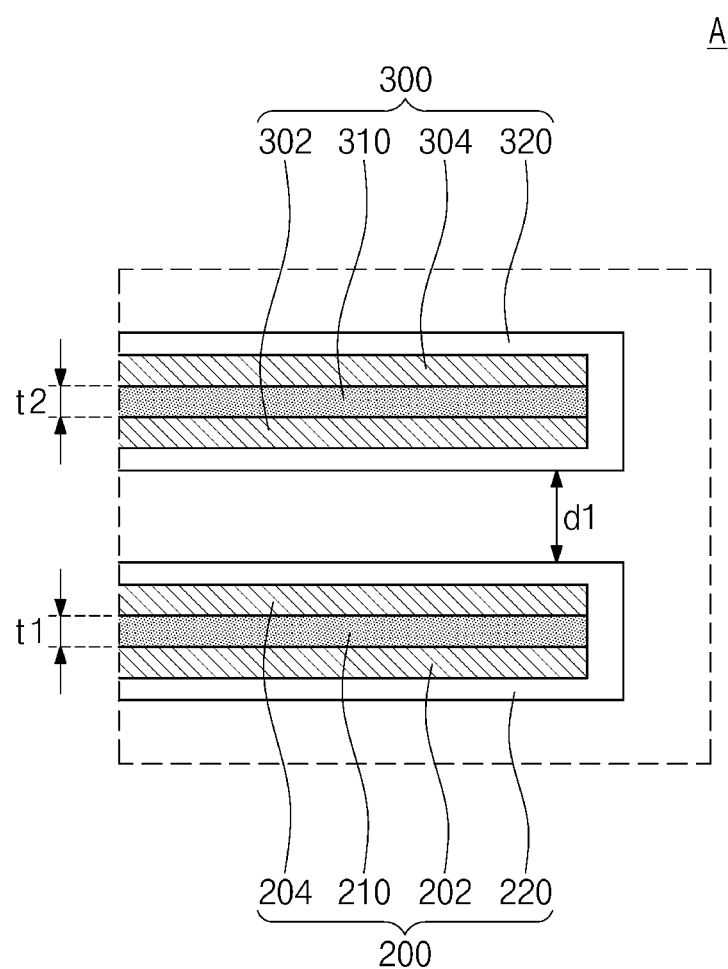
FIG. 5 is an enlarged cross-sectional view corresponding to part A of FIG. 2.
Figure 6A:
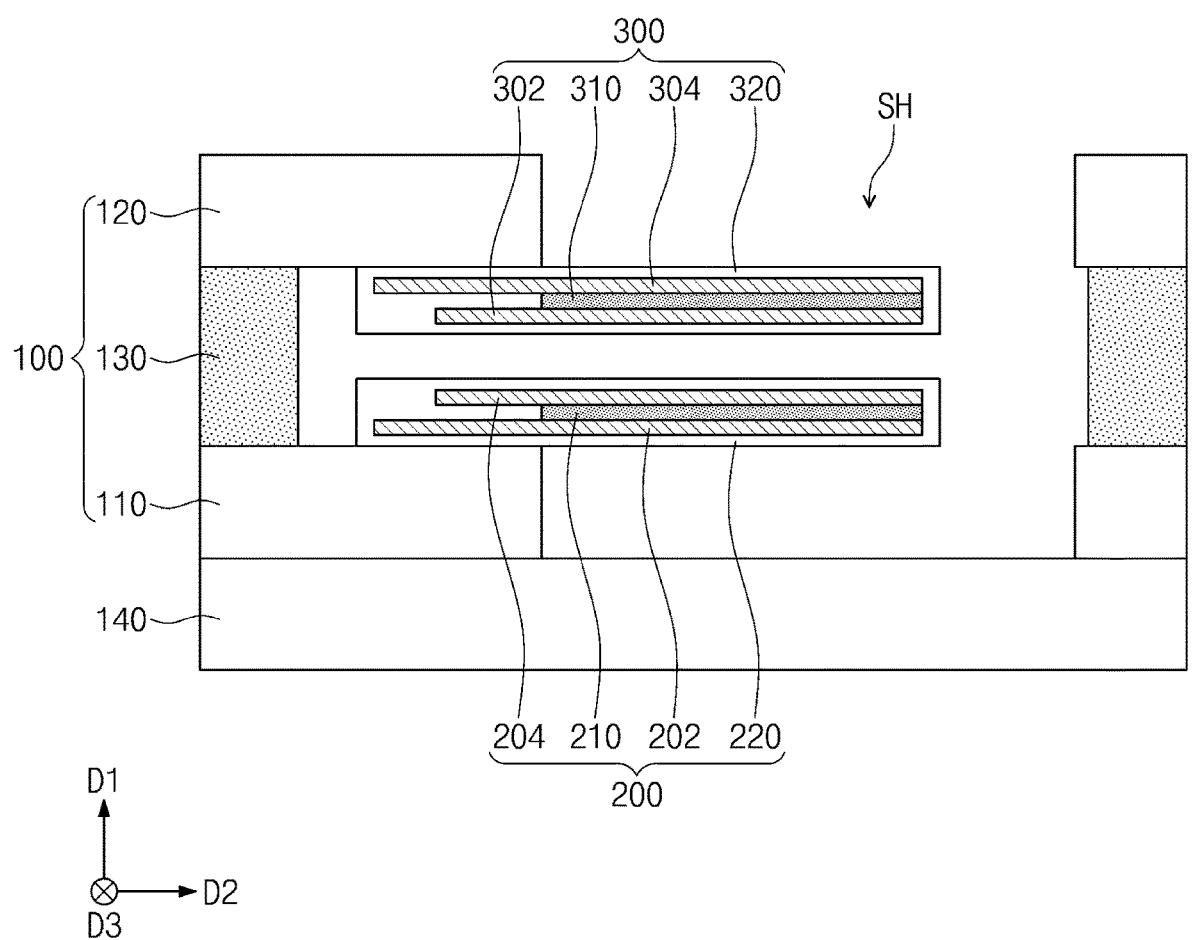
FIGS. 6A and 6B are cross-sectional views illustrating a fluid viscosity measuring device according to embodiments of the inventive concept.
Figure 6B:
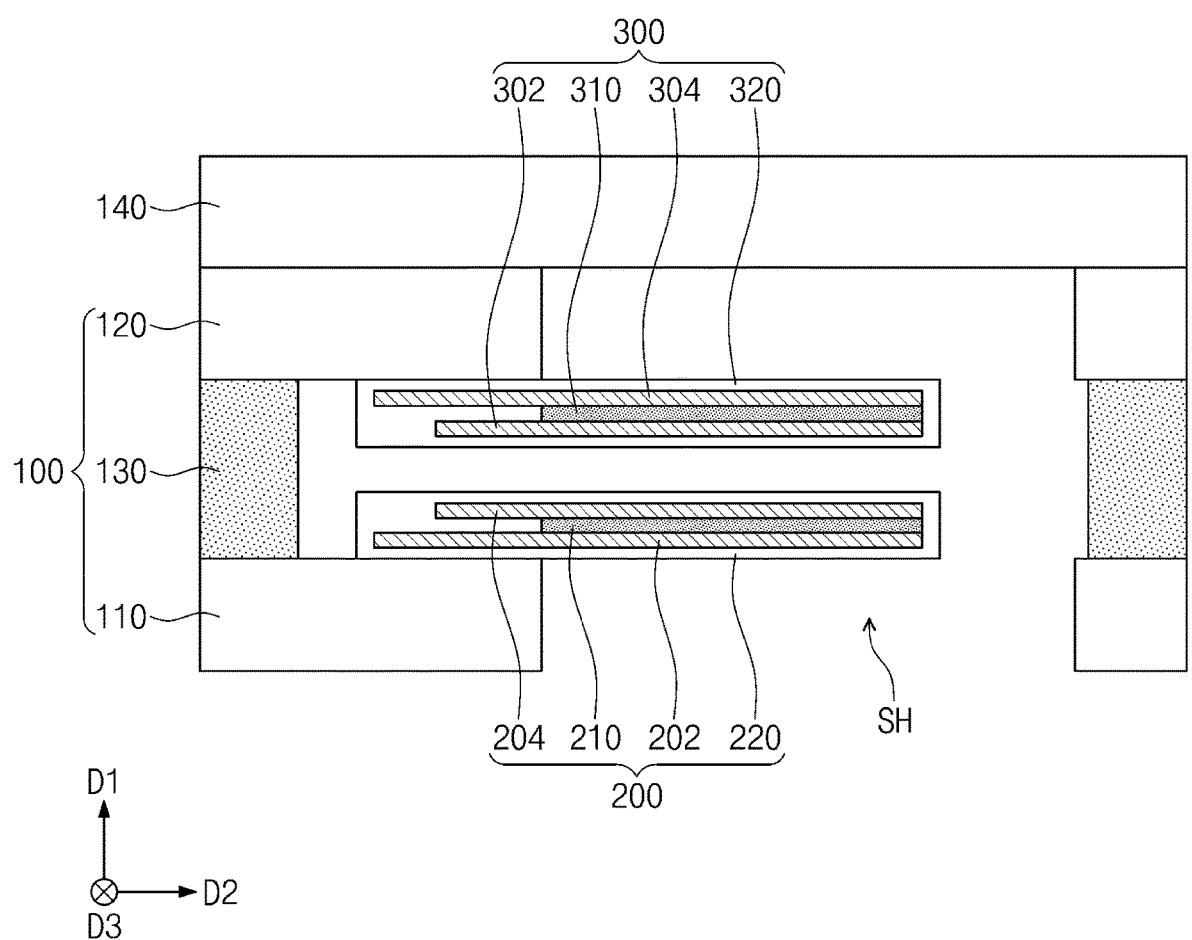

FIG. 1 is an exploded perspective view showing a fluid viscosity measuring device according to embodiments of the inventive concept. FIG. 2 is a cross-sectional view of a fluid viscosity measuring device according to embodiments of the inventive concept and corresponds to line I-I' of FIG. 1. FIG. 3 is a plan view showing a portion of a fluid viscosity measuring device according to embodiments of the inventive concept. FIG. 4 is a plan view showing another portion of a fluid viscosity measuring device according to embodiments of the inventive concept. FIG. 5 is an enlarged cross-sectional view corresponding to part A of FIG. 2. FIGS. 6A and 6B are cross-sectional views illustrating a fluid viscosity measuring device according to embodiments of the inventive concept.

Referring to FIGS. 1 to 5, a fluid viscosity measuring device according to embodiments of the inventive concept may include a support structure 100, a driving resonator 200, and a detection resonator 300.

The support structure 100 may have an opening part SH penetrating it in the first direction D1. The opening part SH is a portion in which the detection target fluid is provided and may be substantially a detection region in which a viscosity of the detection target fluid is measured. The support structure 100 may include a first support layer 110, a middle layer 130, and a second support layer 120 sequentially stacked. The first support layer 110, the middle layer 130, and the second support layer 120 may be insulating layers formed through a MEMS process or a semiconductor process.

Specifically, each of the first support layer 110, the middle layer 130, and the second support layer 120 may have an opening part penetrating them vertically. In other words, the first support layer 110 may have a first opening part penetrating the same in the first direction D1, the middle layer 130 may have a second opening part penetrating the same in the first direction D1, and the second support layer 120 may have a third opening part penetrating the same in the first direction D1. The first opening part, the second opening part, and the third opening part may vertically at least partially overlap. The vertically overlapping portion of the first opening part, the second opening part, and the third opening part may constitute the opening part SH of the support structure 100. According to an example, the first opening part, the second opening part, and the third opening part may have a rectangular shape in plan view. The width of the first opening part and the width of the third opening part may be substantially the same. The width of the second opening part may be greater than the width of the first opening part and the width of the third opening part.

The driving resonator 200 may be fixed to the first support layer 110. The driving resonator 200 may extend from the upper surface of the first support layer 110 into the opening part SH. In other words, the driving resonator 200 may have a shape of a cantilever having a free end in the opening part SH. The driving resonator 200 may extend in the second direction D2 intersecting the first direction D1. One end of the driving resonator 200 may be fixed to the first support layer 110, and the other end of the driving resonator 200 may float in the opening part SH. The driving resonator 200 is a structure formed to have a predetermined natural frequency and may be actively resonated by receiving an external voltage. For example, the driving resonator may be bent up and down by applying a voltage.

The driving resonator 200 may include a first driver electrode 202, a second driver electrode 204, a first piezoelectric body 210, and a driver insulating film 220. In detail, the first driver electrode 202 and the second driver electrode 204 may be arranged side by side in the driving resonator 200. The second driver electrode 204 has a lower surface facing the upper surface of the first driver electrode 202 and may be disposed on the first driver electrode 202. The first driver electrode 202 and the second driver electrode 204 may be spaced apart from each other by the thickness t1 of the first direction D1 of the first piezoelectric body 210 with the first piezoelectric body 210 interposed therebetween. The lengths of the second direction D2 of the first driver electrode 202 and the second driver electrode 204 may be different from each other. For example, the length of the second direction D2 of the first driver electrode 202 may be greater than the length of the second direction D2 of the second driver electrode 204.

The first piezoelectric body 210 may be disposed between the first driver electrode 202 and the second driver electrode 204. The first piezoelectric body 210 may include, for example, PZT, PMN-PT, PZN-PT, PMN-PZT, Micro-fiber Composite (MFC), ZnO, AlN, or the like. The first piezoelectric body 210 receives an electrical signal from the first driver electrode 202 and the second driver electrode 204, so that mechanical displacement may occur. For example, as illustrated in FIG. 3, the first piezoelectric body 210 may be connected to a signal generating circuit 402 through the first driver electrode 202 and the second driver electrode 204. The signal generating circuit 402 may be integrated inside the support structure 100 or may be separately configured outside the fluid viscosity measuring device. The signal generating circuit 402 may include, for example, a pulse generating circuit. The signal generating circuit 402 may apply a pulse voltage having a predetermined resonance frequency to the first piezoelectric body 210. The first piezoelectric body 210 may be periodically displaced by receiving a pulse voltage, and the driving resonator 200 may be resonated according to the displacement of the first piezoelectric body 210.

The driver insulating film 220 may surround the first driver electrode 202, the second driver electrode 204, and the first piezoelectric body 210. As a result, the first driver electrode 202, the second driver electrode 204, and the first piezoelectric body 210 may be insulated from the detection target fluid provided in the opening part SH. According to an example, a portion of the lower surface of the driver insulating film 220 may be fixed by contacting the upper surface of the first support layer 110. The first driver electrode 202, the second driver electrode 204, and the first piezoelectric body 210 in the driver insulating film 220 may be supported substantially parallel to the second direction D2 by the driver insulating film 220.

The driving resonator 200 may include a driving pad part 200p protruding in the third direction D3. The driving resonator 200 may be electrically connected to a circuit or an element through the driving pad part 200p. In the driving pad part 200p, a portion of the first driver electrode 202 and a portion of the second driver electrode 204 may be exposed by the driver insulating film 220.

The detection resonator 300 may be fixed to the second support layer 120 to be spaced apart from the driving resonator 200 in the first direction D1. The detection resonator 300 may extend in the second direction D2 parallel to the driving resonator 200. The distance dl between the detection resonator 300 and the driving resonator 200 may be constant in the second direction D2. One end of the detection resonator 300 may be fixed to the second support layer 120, and the other end of the detection resonator 300 may float in the opening part SH. Like the driving resonator 200, the detection resonator 300 may be a structure formed to have a predetermined resonance frequency. The resonance frequency of the detection resonator 300 may be the same as the resonance frequency of the driving resonator 200. The detection resonator 300 may have a surface facing the driving resonator 200. For example, the lower surface of the detection resonator 300 may face the upper surface of the driving resonator 200. A detection target fluid OF (see FIG. 7A) may be provided between the detection resonator 300 and the driving resonator 200. The detection resonator 300 may interact with the driving resonator 200 through the detection target fluid OF. The detection resonator 300 may resonate together according to the resonance of the driving resonator 200. According to an example, the detection resonator 300 may be resonated at the same frequency as the driving resonator 200 by having substantially the same shape as the driving resonator 200. Specific resonance mechanisms of the detection resonator 300 and the driving resonator 200 will be described later with reference to FIGS. 7A and 7B.

The detection resonator 300 may include a first detector electrode 302, a second detector electrode 304, a second piezoelectric body 310, and a detector insulating film 320.

The first detector electrode 302 and the second detector electrode 304 may be disposed side by side in the detection resonator 300. The first detector electrode 302 and the second detector electrode 304 may be spaced apart from each other with the second piezoelectric body 310 interposed therebetween. The lengths of the second direction D2 of the first detector electrode 302 and the second detector electrode 304 may be different from each other. For example, the length of the second direction D2 of the first detector electrode 302 may be smaller than the length of the second direction D2 of the second detector electrode 304.

The second piezoelectric body 310 may be disposed between the first detector electrode 302 and the second detector electrode 304. The second piezoelectric body 310 may include, for example, PZT, PMN-PT, PZN-PT, PMN-PZT, Micro-fiber Composite (MFC), ZnO, AlN, or the like. The second piezoelectric body 310 may be configured as the same material as the first piezoelectric body 210 and may have the same shape as the first piezoelectric body 210. For example, the first piezoelectric body 210 and the second piezoelectric body 310 may have a shape of a flat plate extending in the second direction D2. The length of the second direction D2 of the first piezoelectric body 210 may be equal to the length of the second direction D2 of the second piezoelectric body 310. Each of the thickness t1 of the first piezoelectric body 210 and the thickness t2 of the second piezoelectric body 310 may be constant in the second direction D2. In addition, the thickness t1 of the first piezoelectric body 210 and the thickness t2 of the second piezoelectric body 310 may be the same.

As the detection resonator 300 resonates, the second piezoelectric body 310 therein may be resonated. The second piezoelectric body 310 may generate an electrical signal according to the generated mechanical displacement. As shown in FIG. 4, the second piezoelectric body 310 may be connected to a signal receiving circuit 404 through the first detector electrode 302 and the second detector electrode 304. The second piezoelectric body 310 may provide the generated electrical signal to the signal receiving circuit 404. The signal receiving circuit 404 may include, for example, an amplifier, a digital converter, or the like, and may generate a pulse signal from an electrical signal provided from the second piezoelectric body 310. In this case, since the first piezoelectric body 210 and the second piezoelectric body 310 have the same shape, the resonance frequency of the detection resonator 300 may be equal to the resonance frequency of the driving resonator 200. Furthermore, by measuring the pulse signal generated by the second piezoelectric body 310, the resonance frequencies of the first piezoelectric body 210 and the second piezoelectric body 310 can be easily estimated.

The detector insulating film 320 may surround the first detector electrode 302, the second detector electrode 304, and the second piezoelectric body 310. As a result, the first detector electrode 302, the second detector electrode 304, and the second piezoelectric body 310 may be insulated from the detection target fluid provided in the opening part SH. According to an example, a portion of the upper surface of the detector insulating film 320 may be fixed in contact with the lower surface of the second support layer 120. The first detector electrode 302, the second detector electrode 304, and the first piezoelectric body 210 in the detector insulating film 320 may be supported substantially parallel to the second direction D2 by the detector insulating film 320.

The detection resonator 300 may include a detection pad part 300p protruding in the third direction D3. The detection resonator 300 may be electrically connected to a circuit or an element through the detection pad part 300p. In the detection pad part 300p, a portion of the first detector electrode 302 and a portion of the second detector electrode 304 may be exposed by the detector insulating film 320.

Referring to FIGS. 6A and 6B, the fluid viscosity measuring device according to embodiments of the inventive concept may further include a support substrate 140 disposed on the support structure 100. One surface of the support substrate 140 may be partially exposed by the opening part SH. In other words, the upper end or lower end of the opening part SH can be closed by the support substrate 140. As a result, the detection target fluid may more easily remain in the opening part SH which is the detection area. According to an example, as shown in FIG. 6A, the support substrate 140 may be disposed closer to the driving resonator 200 than the detection resonator 300. Unlike this, as shown in FIG. 6B, the support substrate 140 may be disposed closer to the detection resonator 300 than the driving resonator 200.

Figure 7A:
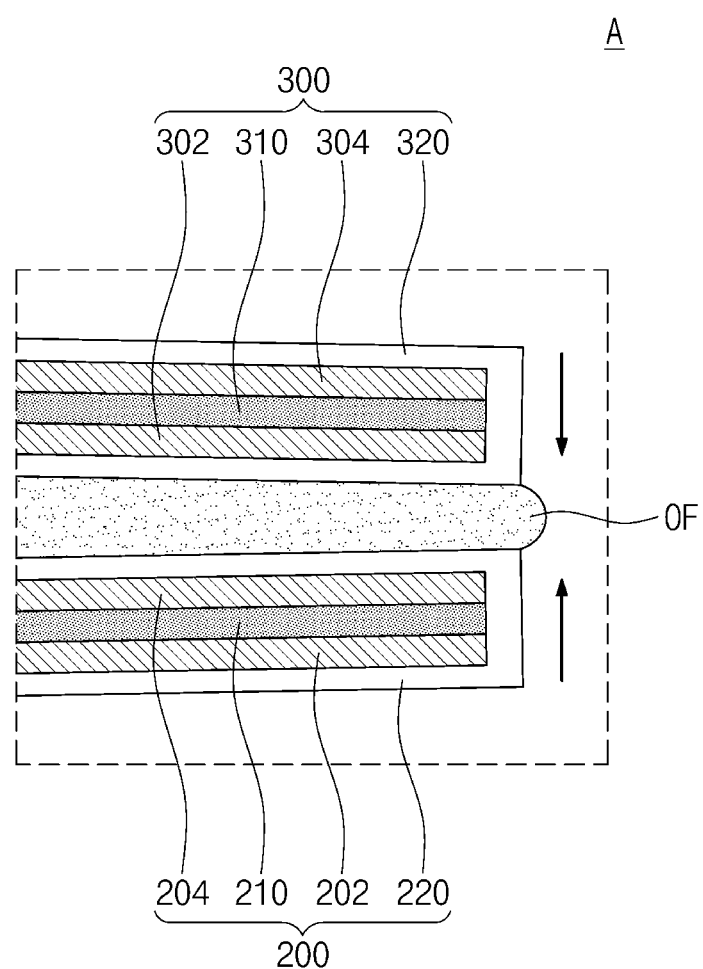
FIGS. 7A and 7B are views for explaining a viscosity measuring method according to embodiments of the inventive concept.
Figure 7B:
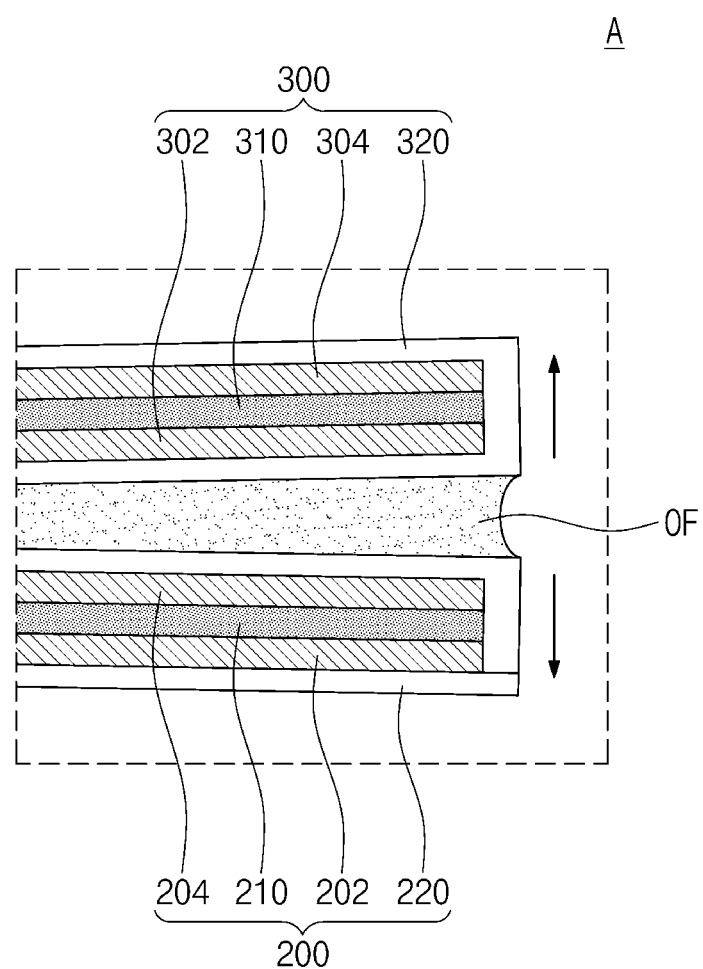

FIGS. 7A and 7B are views for explaining a viscosity measuring method according to embodiments of the inventive concept.

Referring to FIGS. 7A and 7B, a fluid OF may be provided between the driving resonator 200 and the detection resonator 300. The fluid OF may be provided locally between the driving resonator 200 and the detection resonator 300, but the method of measuring the fluid viscosity according to embodiments of the inventive concept is not limited thereto. The fluid OF may be provided to surround the driving resonator 200 and the detection resonator 300, or may be provided to completely fill the opening part SH (see FIG. 2) of the support structure 100.

When a pulse signal corresponding to a natural frequency is applied to the driving resonator 200, the driving resonator 200 may be bent up and down. In this case, a squeezing effect may occur in the fluid OF between the driving resonator 200 and the detection resonator 300. The squeezing effect may include repetitive movement of the fluid OF into or out of a gap defined between the driving resonator 200 and the detection resonator 300. By the movement of the fluid OF according to the squeezing effect, the detection resonator 300 may be driven at the same frequency as the resonance mode frequency of the driving resonator 200 to operate in the same resonance mode. As a result, an electrical signal is generated in the second piezoelectric body 310, and the signal may have the same frequency as the signal applied to the driving resonator 200 and may have different magnitudes and phases. The magnitude and phase of the signal generated by the second piezoelectric body 310 are determined by the viscosity of the fluid OF and the squeezing effect caused by the gap, and the magnitude and phase of the signal may vary depending on the viscosity. That is, the viscosity of the fluid may be measured through the magnitude and phase of the signal received from the second piezoelectric body 310.

According to embodiments of the inventive concept, when the resonance mode of the driving resonator 200 is transmitted to the detection resonator 300 through the detection target fluid OF, the viscosity of the fluid can be measured using the change in the properties of the resonant mode by the viscosity of the fluid. In this way, the viscosity of the fluid can be measured in real time. In addition, according to embodiments of the inventive concept, without a need to know some of the properties of the fluid or assume as known values, since the viscosity of the fluid can be measured directly, more reliable viscosity measurement results can be obtained.

Unlike the method of detecting the characteristic change of the resonator actively resonating in the fluid, since the fluid viscosity measuring device according to the embodiments of the inventive concept detects the change in the resonance mode transmitted between the resonators according to the viscosity characteristics of the fluid, such that more reliable viscosity measurement results can be obtained.

Figure 8:
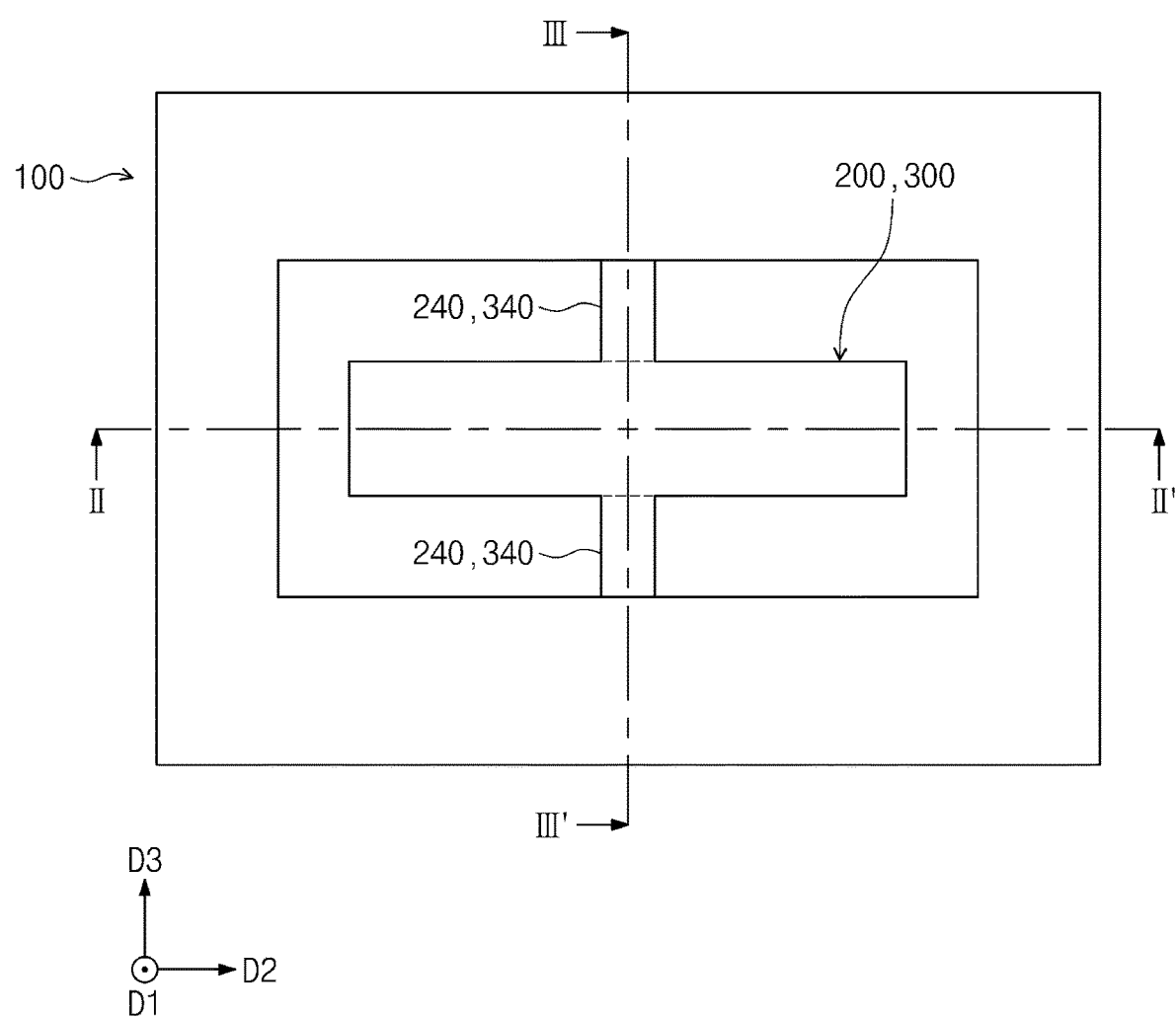
FIG. 8 is a plan view for describing a fluid viscosity measuring device according to embodiments of the inventive concept.
Figure 9A:
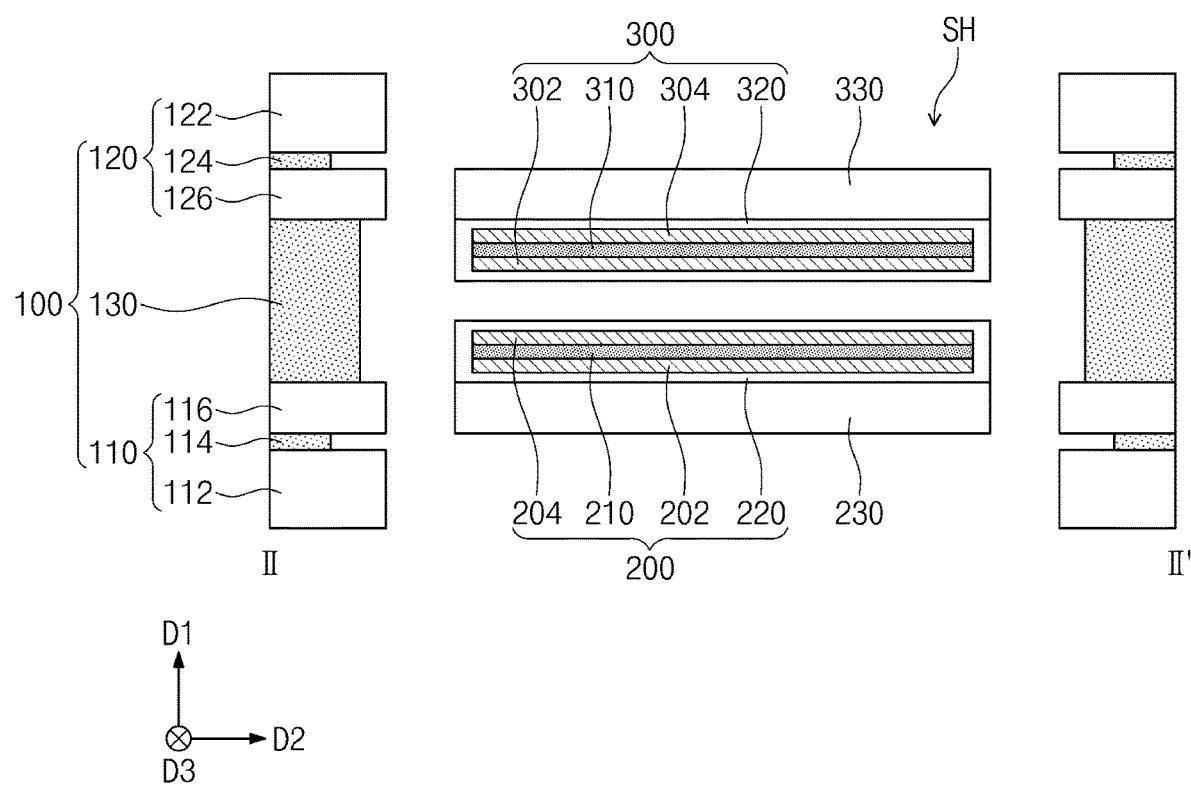
FIGS. 9A and 9B are cross-sectional views taken along line II-II' and line III-III' of FIG. 8, respectively, to explain a fluid viscosity measuring device according to embodiments of the inventive concept.
Figure 9B:
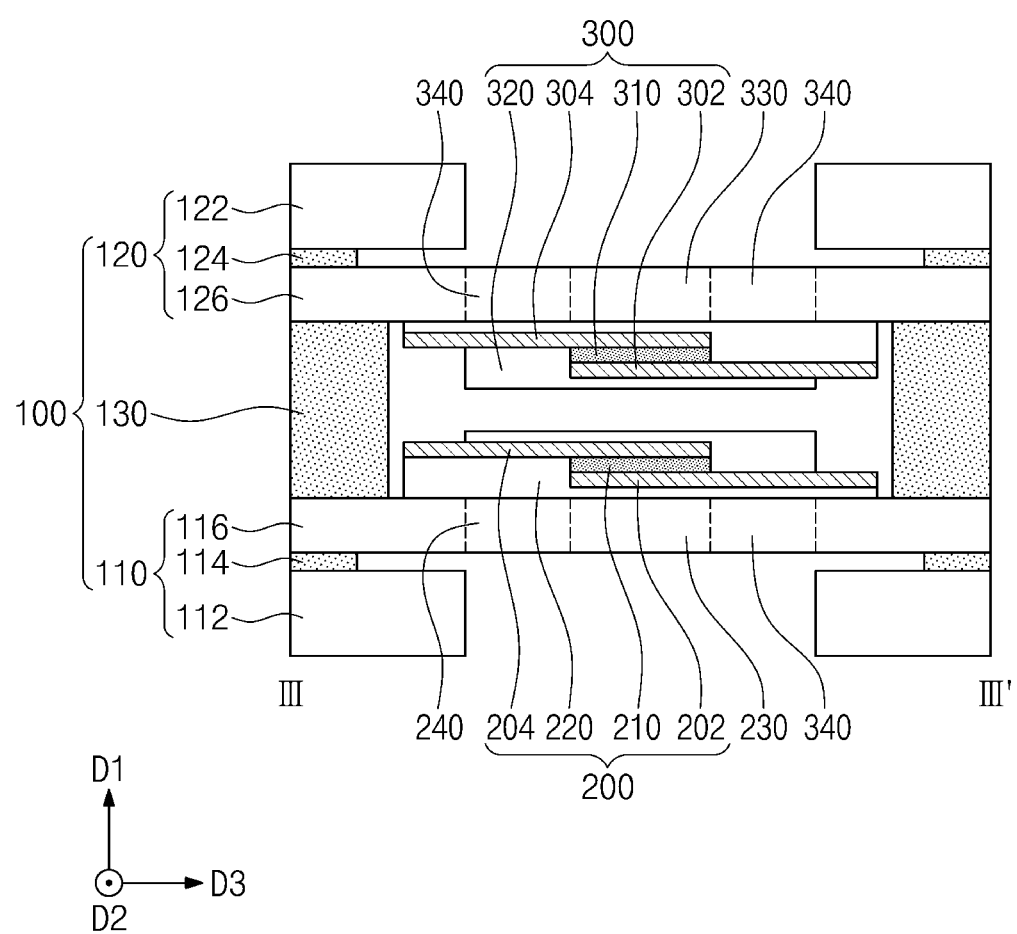

FIG. 8 is a plan view for describing a fluid viscosity measuring device according to embodiments of the inventive concept. FIGS. 9A and 9B are cross-sectional views taken along line II-II' and line III-III' of FIG. 8, respectively, to explain a fluid viscosity measuring device according to embodiments of the inventive concept.

For concise description, a description on the same technical features of the fluid viscosity measuring device described above may be omitted.

Referring to FIGS. 8, 9A and 9B, the support structure 100 may have an opening part SH penetrating it in the first direction D1. The support structure 100 may include a first support layer 110, a middle layer 130, and a second support layer 120 sequentially stacked. First and second resonator support parts 230 and 330 may extend from the support structure 100 and be disposed within the opening part SH. The first resonator support part 230 may support the driving resonator 200, and the second resonator support part 330 may support the detection resonator 300.

In detail, the first support layer 110 may include a first lower layer 112, a second lower layer 114, and a third lower layer 116 sequentially stacked. The third lower layer 116 and the first resonator support part 230 may be connected through the first connection parts 240. The third lower layer 116, the first resonator support part 230, and the first connection parts 240 may be connected to each other to form a single body. The first resonator support part 230 may extend in the second direction D2 in the opening part SH. The first connection parts 240 may extend in a third direction D3 intersecting the first direction D1 and the second direction D2 to connect the third lower layer 116 and the first resonator support part 230. The first connection parts 240 may be formed on an extension line of the center line in the second direction D2 of the first resonator support part 230. As a result, while the driving resonator 200 resonates, asymmetrical movement of the driving resonator 200 may be prevented, and stress transmitted to the first connection parts 240 may be reduced.

The second support layer 120 may include a first upper layer 126, a second upper layer 124, and a third upper layer 122 sequentially stacked. The first upper layer 126 and the second resonator support part 330 may be connected through the second connection parts 340. The first upper layer 126, the second resonator support part 330, and the second connection parts 340 may be connected to each other to form a single body. The first resonator support part 230 may extend in the second direction D2 in the opening part SH. The second connection parts 340 may extend in the third direction D3 intersecting the first direction D1 and the second direction D2 to connect the first upper layer 126 and the second resonator support part 330. The second connection parts 340 may be formed on an extension line of the center line in the second direction D2 of the second resonator support part 330. In other words, the second connection parts 340 may vertically overlap the first connection parts 240. As a result, the detection resonator 300 supported by the second resonator support part 330 may have the same resonance mode as the driving resonator 200.

In this example, the driving resonator 200 and the detection resonator 300 may be spaced apart from each other in the first direction D1. In other words, the driving resonator 200 may be disposed on the upper surface of the first resonator support part 230, and the detection resonator 300 may be disposed on the lower surface of the second resonator support part 330. The driving resonator 200 and the detection resonator 300 may face each other in the first direction D1. The detection resonator 300 may have a lower surface facing the upper surface of the driving resonator 200. A detection target fluid may be provided between an upper surface of the driving resonator 200 and a lower surface of the detection resonator 300. When the driving resonator 200 resonates, the detection target fluid may transmit a resonance mode to the detection resonator 300. The driving resonator 200 and the detection resonator 300 may operate in a thickness-extension mode.

Figure 10:
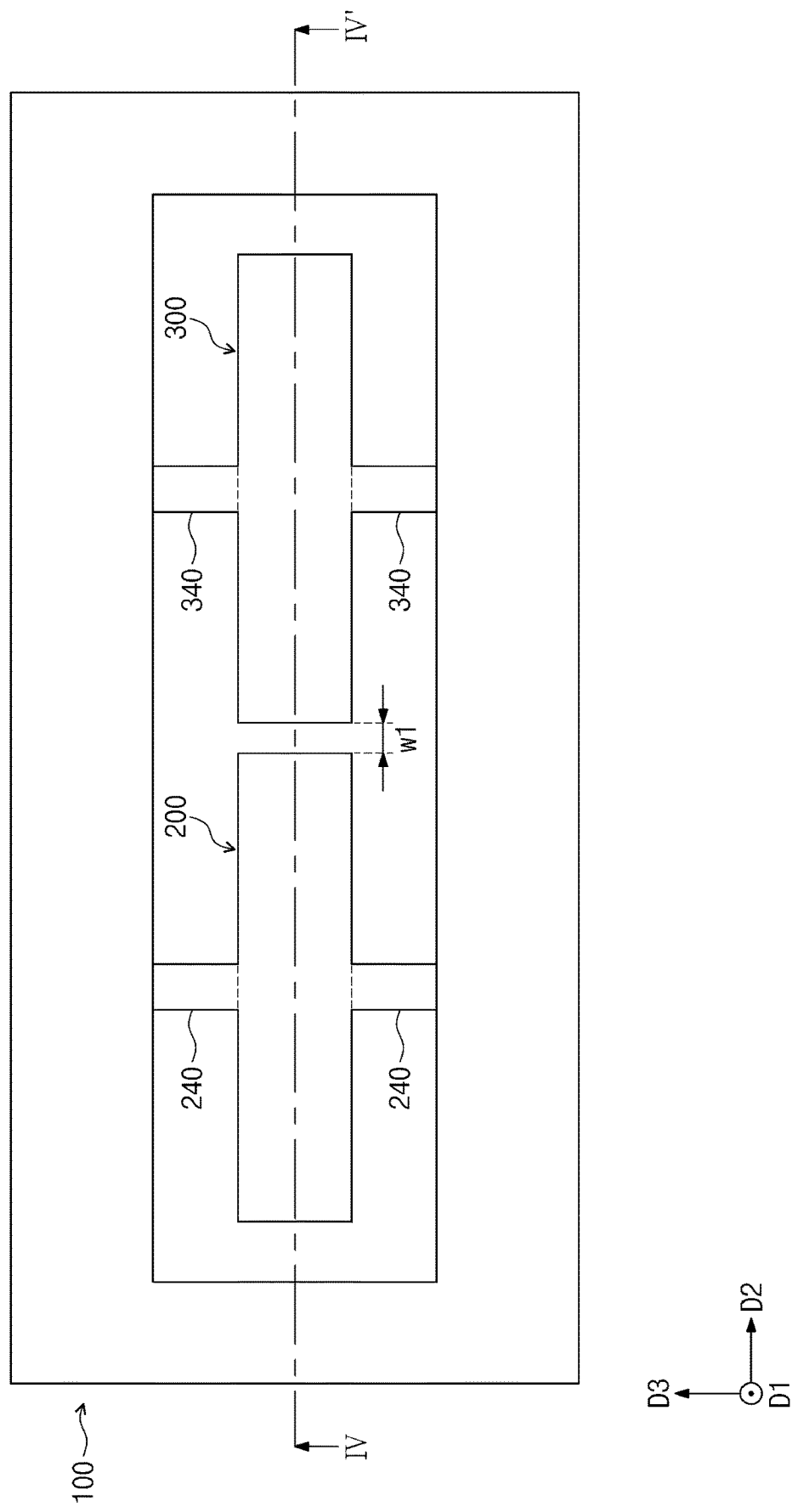
FIG. 10 is a plan view for describing a fluid viscosity measuring device according to embodiments of the inventive concept.
Figure 11:
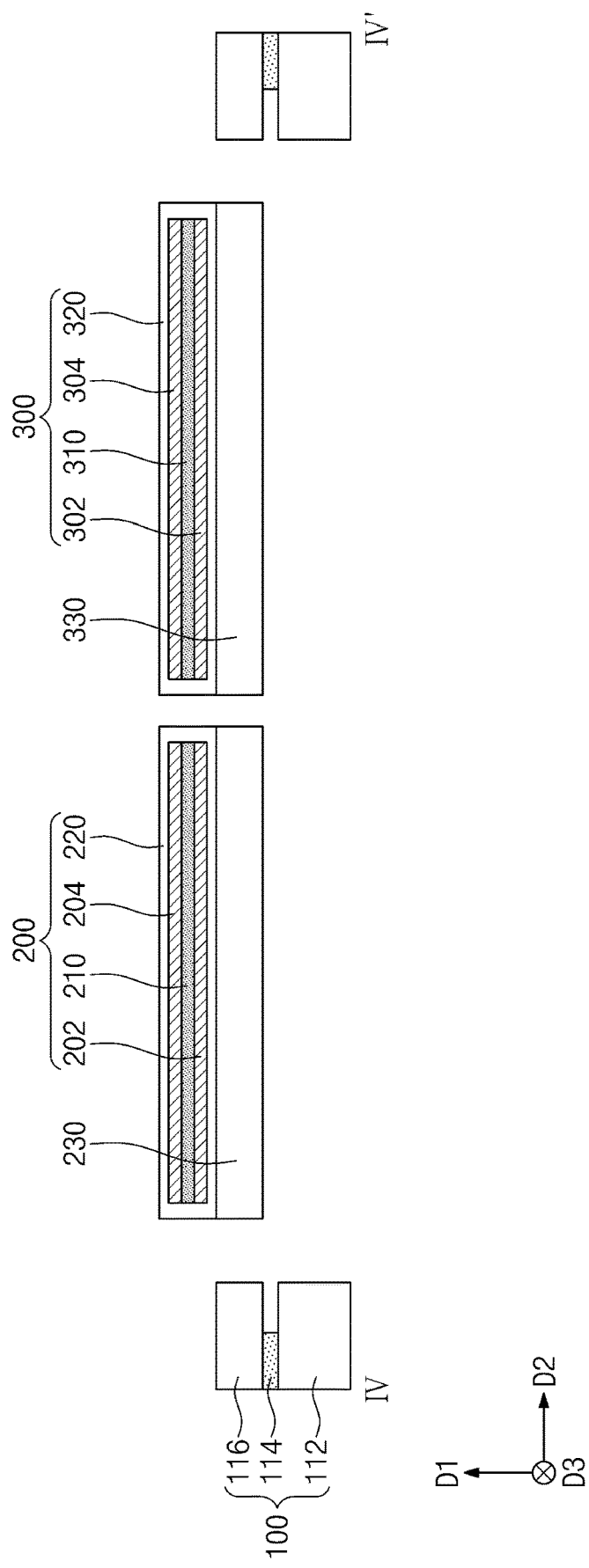
FIG. 11 is a cross-sectional view taken along line IV-IV' of FIG. 10 to explain a fluid viscosity measuring device according to embodiments of the inventive concept.

FIG. 10 is a plan view for describing a fluid viscosity measuring device according to embodiments of the inventive concept. FIG. 11 is a cross-sectional view taken along line IV-IV' of FIG. 10 to explain a fluid viscosity measuring device according to embodiments of the inventive concept.

For concise description, a description on the same technical features of the fluid viscosity measuring device described above may be omitted.

Referring to FIGS. 10 and 11, the support structure 100 may include a first lower layer 112, a second lower layer 114, and a third lower layer 116 sequentially stacked. The first resonator support part 230 may be connected to the third lower layer 116 through the first connection parts 240, and the second resonator support part 330 may be connected to the third lower layer 116 through the second connection parts 340. In other words, the first resonator support part 230, the second resonator support part 330, the third lower layer 116, the first connection parts 240, and the second connection parts 340 are connected to each other to form a single body.

The driving resonator 200 may be disposed on the first resonator support part 230, and the detection resonator 300 may be disposed on the second resonator support part 330. Each of the driving resonator 200 and the detection resonator 300 may extend in the second direction D2 in the opening part SH. The driving resonator 200 and the detection resonator 300 may be spaced apart from each other in the second direction D2. The detection resonator 300 may have a side surface facing the side surface of the driving resonator 200. The detection resonator 300 and the driving resonator 200 may operate in a length-extension mode. The detection target fluid may be disposed between at least the opposite sides of the detection resonator 300 and the driving resonator 200 for viscosity measurement. According to the operation of the driving resonator 200, the distance w1 between the detection resonator 300 and the driving resonator 200 may be periodically changed. As a result, the detection target fluid may be squeezed, and the resonance mode of the driving resonator 200 may be transmitted to the detection resonator 300.

FIGS. 12 to 16 are views for explaining a method of manufacturing a fluid viscosity measuring device according to embodiments of the inventive concept.

Figure 12:
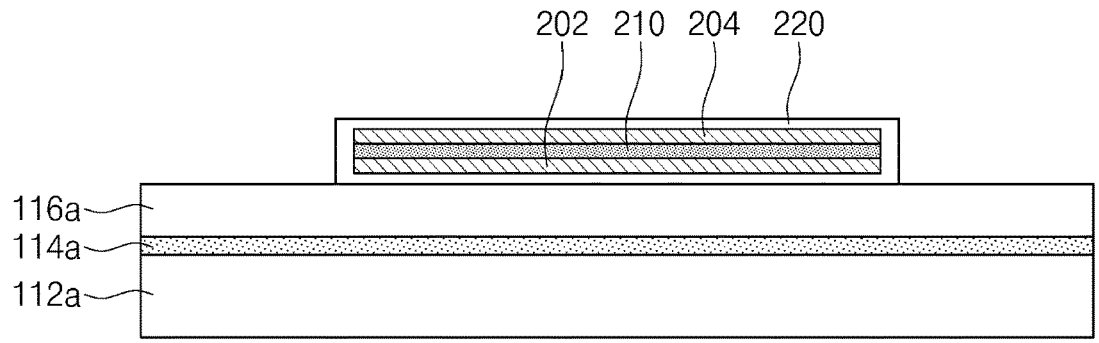
FIGS. 12 to 16 are views for explaining a method of manufacturing a fluid viscosity measuring device according to embodiments of the inventive concept.

Referring to FIG. 12, a preliminary second lower layer 114a and a preliminary third lower layer 116a may be sequentially stacked on a preliminary first lower layer 112a. For example, the preliminary first lower layer 112a, the preliminary second lower layer 114a, and the preliminary third lower layer 116a may be insulating layers sequentially stacked. For example, the preliminary first lower layer 112a, the preliminary second lower layer 114a, and the preliminary third lower layer 116a may be part of a silicon on insulator (SOI) wafer.

The driving resonator 200 may be formed on the preliminary third lower layer 116a. The driving resonator 200 may be formed using a deposition process and a patterning process. Forming the driving resonator 200 may include forming a first insulating film, sequentially forming a first driver electrode 202, a first piezoelectric body 210, and a second driver electrode 204 on the first insulating film, and forming a second insulating film covering the first driver electrode 202, the first piezoelectric body 210, and the second driver electrode 204. The first insulating film and the second insulating film may constitute a driver insulating film 220.

Figure 13:
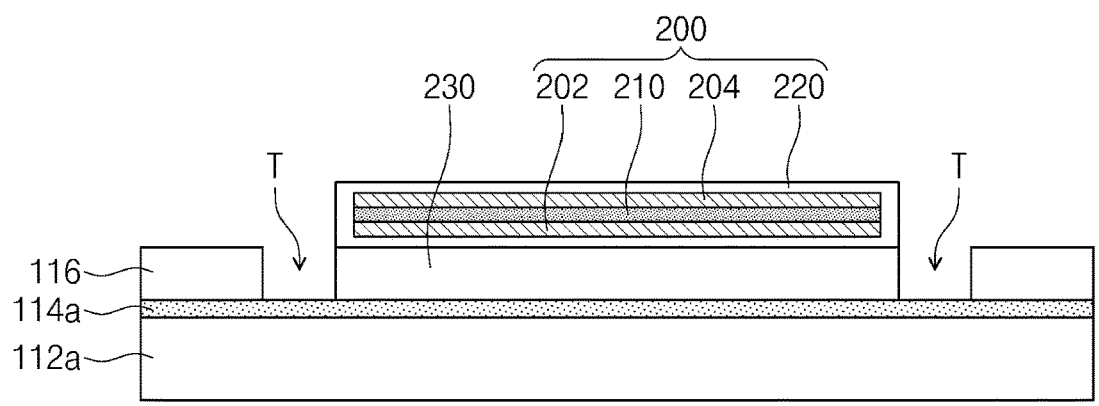

Referring to FIG. 13, the preliminary third lower layer 116a may be patterned to form the third lower layer 116 and the first resonator support part 230. Patterning the preliminary third lower layer 116*a* may include forming a trench T exposing the second lower layer 114 on the preliminary third lower layer 116*a*. The trench T may be formed by an anisotropic etching process using the preliminary second lower layer 114*a* as an etch stop layer.

Figure 14:
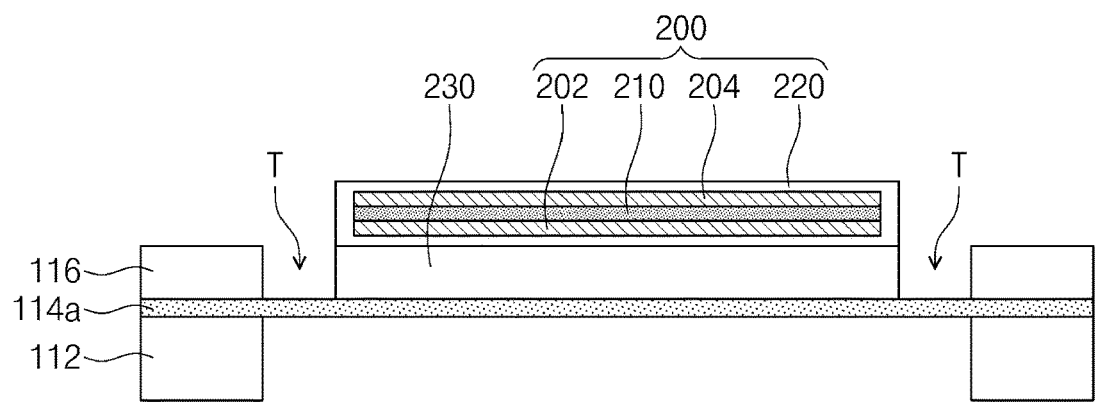

Referring to FIG. 14, a portion of the preliminary first lower layer 112*a* may be removed to form the first lower layer 112. The first lower layer 112 may expose a portion of the lower surface of the preliminary second lower layer 114*a*.

Figure 15:
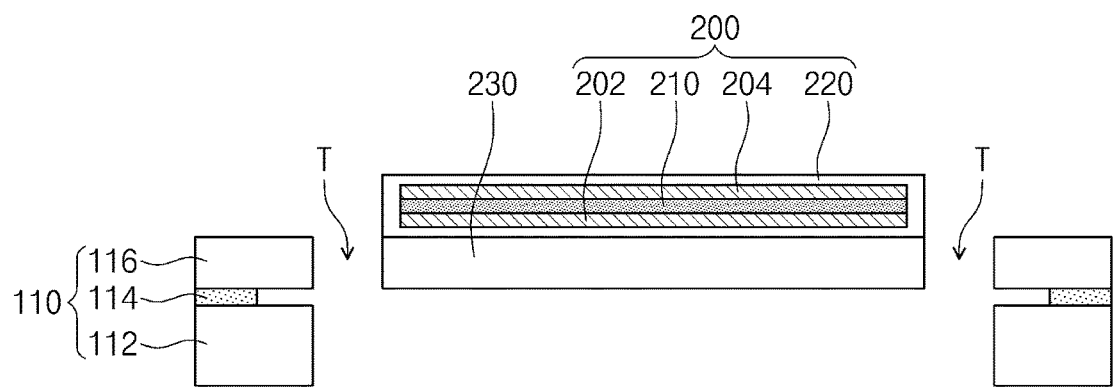

Referring to FIG. 15, a first support layer 110 including a first lower layer 112, a second lower layer 114, and a third lower layer 116 may be formed by removing a part of the preliminary second lower layer 114*a*. As illustrated in FIGS. 8 and 9B, the first resonator support part 230 may be connected to the third lower layer 116 by the first connection parts 240 and supported.

The preliminary second lower layer 114*a* may include a material having an etch selectivity with respect to the first lower layer 112 and the third lower layer 116. Removing part of the preliminary second lower layer 114*a* may be performed using an isotropic etching process with a recipe capable of selectively etching the second lower layer 114.

Figure 16:
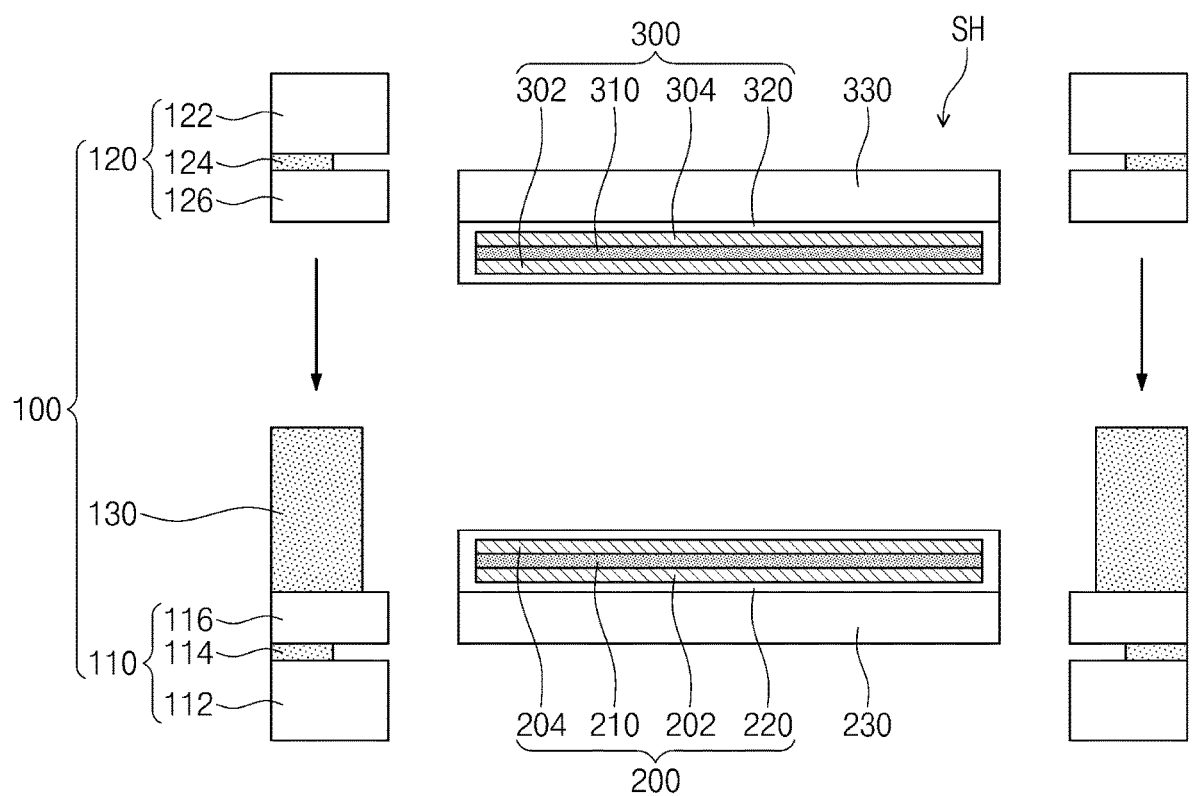

Referring to FIG. 16, the detection resonator 300 and the second support layer 120 may be formed in the same/similar manner to the method described with reference to FIGS. 12 to 15. Subsequently, the second support layer 120 may be fixed on the first support layer 110 with the middle layer 130 interposed. In this case, the second support layer 120 may be fixed on the first support layer 110 such that one surface of the detection resonator 300 faces the upper surface of the driving resonator 200.

According to embodiments of the inventive concept, a fluid viscosity measuring device having high reliability and easy manufacturing may be provided.

Although the exemplary embodiments of the inventive concept have been described, it is understood that the inventive concept should not be limited to these exemplary embodiments but various changes and modifications can be made by one ordinary skilled in the art within the spirit and scope of the inventive concept as hereinafter claimed.

What is claimed is:

1. A fluid viscosity measuring device comprising:
 a support structure having an opening part, the opening part penetrating the support structure in a first direction;
 a driving resonator fixed to the support structure and extending to overlap the opening part; and
 a detection resonator fixed to the support structure and extending parallel to the driving resonator, the detection resonator being spaced apart from the driving resonator in the first direction,
 wherein the driving resonator comprises a first piezoelectric body,
 wherein the detection resonator comprises a second piezoelectric body,
 wherein the first piezoelectric body and the second piezoelectric body have the same shape.

2. The fluid viscosity measuring device of claim 1, wherein each of the driving resonator and the detection resonator has a shape of a cantilever having a free end in the opening part.

3. The fluid viscosity measuring device of claim 1, wherein the first piezoelectric body and the second piezoelectric body have the same thickness in the first direction.

4. The fluid viscosity measuring device of claim 1, wherein the first piezoelectric body and the second piezoelectric body extend in a second direction perpendicular to the first direction and have the same length in the second direction.

5. The fluid viscosity measuring device of claim 1, wherein the driving resonator comprises driver electrodes spaced apart from each other with the first piezoelectric body interposed therebetween,
 wherein the detection resonator comprises sensor part electrodes spaced apart from each other with the second piezoelectric body interposed therebetween.

6. The fluid viscosity measuring device of claim 5, wherein the driving resonator comprises a driver insulating film surrounding the first piezoelectric body and the driver electrodes,
 wherein the detection resonator comprises a sensor part insulating film surrounding the second piezoelectric body and the detection resonator.

7. The fluid viscosity measuring device of claim 6, wherein the driving resonator and the detection resonator have the same size and shape.

8. The fluid viscosity measuring device of claim 7, wherein the driving resonator and the detection resonator have the same natural frequency.

9. The fluid viscosity measuring device of claim 1, wherein the support structure comprises a first support layer, a second support layer, and a third support layer sequentially stacked,
 wherein the driving resonator is fixed to an upper surface of the first support layer,
 wherein the detection resonator is fixed to a lower surface of the third support layer.

10. The fluid viscosity measuring device of claim 9, wherein a thickness of the first direction of the second support layer is greater than a sum of a thickness of the driving resonator and a thickness of the detection resonator.

11. The fluid viscosity measuring device of claim 1, wherein the driving resonator and the detection resonator extend in a second direction perpendicular to the first direction,
 wherein a distance between the driving resonator and the detection resonator is constant along the second direction.

12. The fluid viscosity measuring device of claim 1, further comprising a support substrate disposed on the support structure and having one side partially exposed by the opening part.

\* \* \* \* \*